US012787789B2

United States Patent

Seo et al.

(12) United States Patent
(10) Patent No.: US 12,787,789 B2
(45) Date of Patent: Nov. 3, 2026

(54) SECURITY CODE INCLUDING METAMATERIALS

(71) Applicant: KOREA INSTITUTE OF SCIENCE AND TECHNOLOGY, Seoul (KR)

(72) Inventors: Minah Seo, Seoul (KR); Geon Lee, Seoul (KR); Yeeun Roh, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 619 days.

(21) Appl. No.: 18/322,996

(22) Filed: May 24, 2023

(65) Prior Publication Data

US 2024/0290732 A1 Aug. 29, 2024

(30) Foreign Application Priority Data

Feb. 28, 2023 (KR) ........................ 10-2023-0026902

(51) Int. Cl.
*H10W 42/40* (2026.01)
*G06K 19/073* (2006.01)

(52) U.S. Cl.
CPC ...... *H10W 42/40* (2026.01); *G06K 19/07327* (2013.01)

(58) Field of Classification Search
CPC ..... H10W 42/40; B42D 25/30; B42D 25/373; B42D 25/36; G06K 19/0672
See application file for complete search history.

(56) References Cited

U.S. PATENT DOCUMENTS

| | | | | |
|---|---|---|---|---|
| 9,705,311 | B1 * | 7/2017 | Brener | G02B 1/002 |
| 2016/0358058 | A1 * | 12/2016 | Gibson | H05K 1/092 |
| 2017/0116808 | A1 * | 4/2017 | Kobrin | B42D 25/36 |
| 2017/0178059 | A1 * | 6/2017 | Gibson | G06Q 10/087 |
| 2017/0329230 | A1 * | 11/2017 | Buchar | G03F 7/2053 |
| 2020/0371022 | A1 * | 11/2020 | Al-Naib | G01N 21/3586 |

FOREIGN PATENT DOCUMENTS

| | | | |
|---|---|---|---|
| CN | 105046309 | A | 11/2015 |
| CN | 105811120 | A | 7/2016 |
| JP | 2016-141065 | A | 8/2016 |
| KR | 10-1542109 | B1 | 8/2015 |
| KR | 10-2019-0034112 | A | 4/2019 |

OTHER PUBLICATIONS

Muhammad Afnan Ansari et al. "Engineering spin and antiferromagnetic resonances to realize an efficient direction-multiplexed visible meta-hologram", Nanoscale Horizons, 2020, V. 5, pp. 57-64.

* cited by examiner

*Primary Examiner* — Jesse Y Miyoshi

(57) ABSTRACT

Provided is a security code including a substrate, metamaterials on the substrate, a signal modulation pattern on the metamaterials, and a capping layer covering the signal modulation pattern and the metamaterials, wherein the metamaterials include a pair of metal patterns facing each other, the signal modulation pattern covers a portion of the metal patterns, and expose remaining of the metal patterns, and the signal modulation pattern has a different material from each of the metal patterns.

16 Claims, 9 Drawing Sheets

U1

SECURITY CODE INCLUDING METAMATERIALS

CROSS-REFERENCE TO RELATED APPLICATIONS

This U.S. non-provisional patent application claims priority under 35 U.S.C. § 119 of Korean Patent Application No. 10-2023-0026902, filed on Feb. 28, 2023, the entire contents of which are hereby incorporated by reference.

BACKGROUND

The present disclosure herein relates to a security code including metamaterials, and more particularly, to a security code including metamaterials, which may be read using terahertz waves.

Information authentication and information identification technologies using typical optical devices adopt a technique using light in a band corresponding to infrared rays, visible light, microwaves or the like.

For the technologies using the light in the corresponding band, a light source may be relatively easily obtained and thus it is relatively easy to copy information.

In particular, as the lithography technology evolves, a counterfeiting method becomes sophisticated. Accordingly, a new technology is required for replacing the existing anti-copy method.

SUMMARY

The present disclosure provides the structure of a security code that may be read only through terahertz waves using metamaterials.

The present disclosure also provides the structure of a security code by which a terahertz signal is modulated to improve the security.

Issues to be addressed in the present disclosure are not limited to those described above and other issues unmentioned above will be clearly understood by those skilled in the art from the following description.

An embodiment of the inventive concept provides a security code including: a substrate; metamaterials on the substrate; a signal modulation pattern on the metamaterials; and a capping layer covering the signal modulation pattern and the metamaterials, wherein the metamaterials include a pair of metal patterns facing each other, the signal modulation pattern covers a portion of the metal patterns, and expose remaining of the metal patterns, and the signal modulation pattern has a different material from each of the metal patterns.

In an embodiment, each of the pair of metal patterns may have a split ring.

In an embodiment, any one of the metal patterns may have a relationship of a mirror image with another metal pattern.

In an embodiment, the signal modulation pattern may include any one of a semiconductor material, a two-dimensional material, or a metal compound.

In an embodiment, the semiconductor material may include any one of silicon (Si), germanium (Ge), silicon-germanium (Si—Ge), or gallium arsenide (GaAs).

In an embodiment, each of the metal patterns may include any one of gold (Au), silver (Ag), copper (Cu), or platinum (Pt).

In an embodiment, the substrate may include polymer or semiconductor.

In an embodiment, each thickness of the metal patterns may be about 80 nm to about 300 nm.

In an embodiment, the signal modulation pattern may cover any one of the pair of metal patterns, and may not cover the other.

In an embodiment, the signal modulation pattern may cover all the pair of metal patterns, wherein a planar area covering the any one of the pair of metal patterns is greater than a planer area covering the other.

In an embodiment, each of the pair of metal patterns may have a rectangular parallelepiped shape.

In an embodiment of the inventive concept, a security code includes: a substrate; metamaterials on the substrate; a signal modulation pattern on the metamaterials; and a capping layer covering the signal modulation pattern and the metamaterials, wherein the metamaterials include a first pattern hole and a second hole facing each other, the signal modulation pattern fills at least a portion of any one of the first pattern hole and the second hole, and the signal modulation pattern includes a material different from the metamaterials.

In an embodiment the signal modulation pattern may include any one of a semiconductor material, a two-dimensional material, or a metal compound.

In an embodiment the semiconductor material may include any one of silicon (Si), germanium (Ge), silicon-germanium (Si—Ge), or gallium arsenide (GaAs).

In an embodiment the metamaterials may include any one of gold (Au), silver (Ag), copper (Cu), or platinum (Pt).

In an embodiment of the inventive concept, a security code includes: a substrate; a metamaterial array on the substrate; a plurality of signal modulation patterns on the metamaterial array; and a capping layer covering the signal modulation pattern and the metamaterial array, wherein the metamaterial array includes a plurality of unit cells, each of the unit cells includes a first metal pattern and a second metal pattern spaced apart from each other along a first direction parallel to a top surface of the substrate, the first metal pattern and the second metal pattern have a symmetric shape, the signal modulation patterns are respectively disposed on the unit cells, the signal modulation pattern asymmetrically covers the first metal pattern and the second metal pattern, and the signal modulation pattern has a different material from the first metal pattern and the second metal pattern.

In an embodiment, the signal modulation pattern may cover an entirety of the first metal pattern, and exposes at least a portion of the second metal pattern.

In an embodiment, the signal modulation pattern may cover the first metal pattern and the second metal pattern, and a planar area vertically overlapping the first metal pattern of the signal modulation pattern is larger than a second planar area vertically overlapping the second metal pattern of the signal modulation pattern.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

The embodiments of the present invention will now be described with reference to the accompanying drawings for sufficiently understating a configuration and effects of the inventive concept. However, the inventive concept is not limited to the following embodiments and may be embodied in different ways, and various modifications may be made thereto. The embodiments are just given to provide complete disclosure of the inventive concept and to provide thorough understanding of the inventive concept to those skilled in the art. In the accompanying drawings, the sizes of the elements may be greater than the actual sizes thereof, for convenience of description, and the scales of the elements may be exaggerated or reduced.

Figure 1:
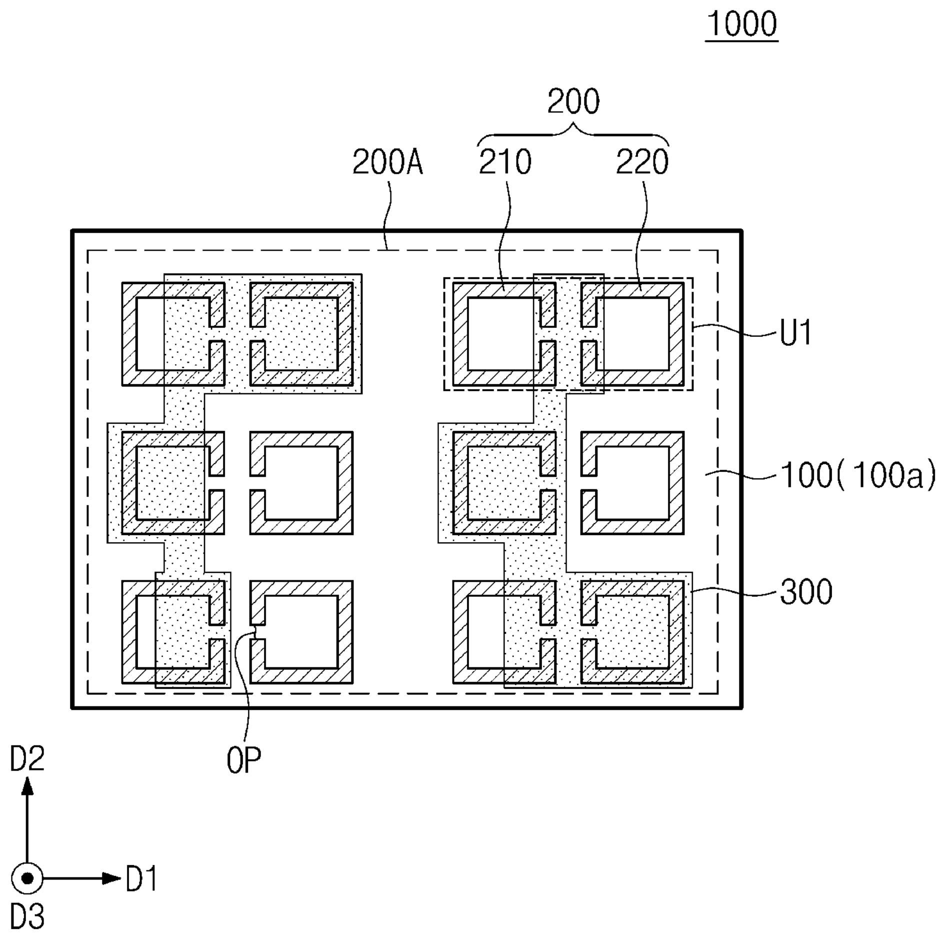
FIG. 1 is a plan view schematically illustrating a security code according to an embodiment of the inventive concept.
Figure 2:
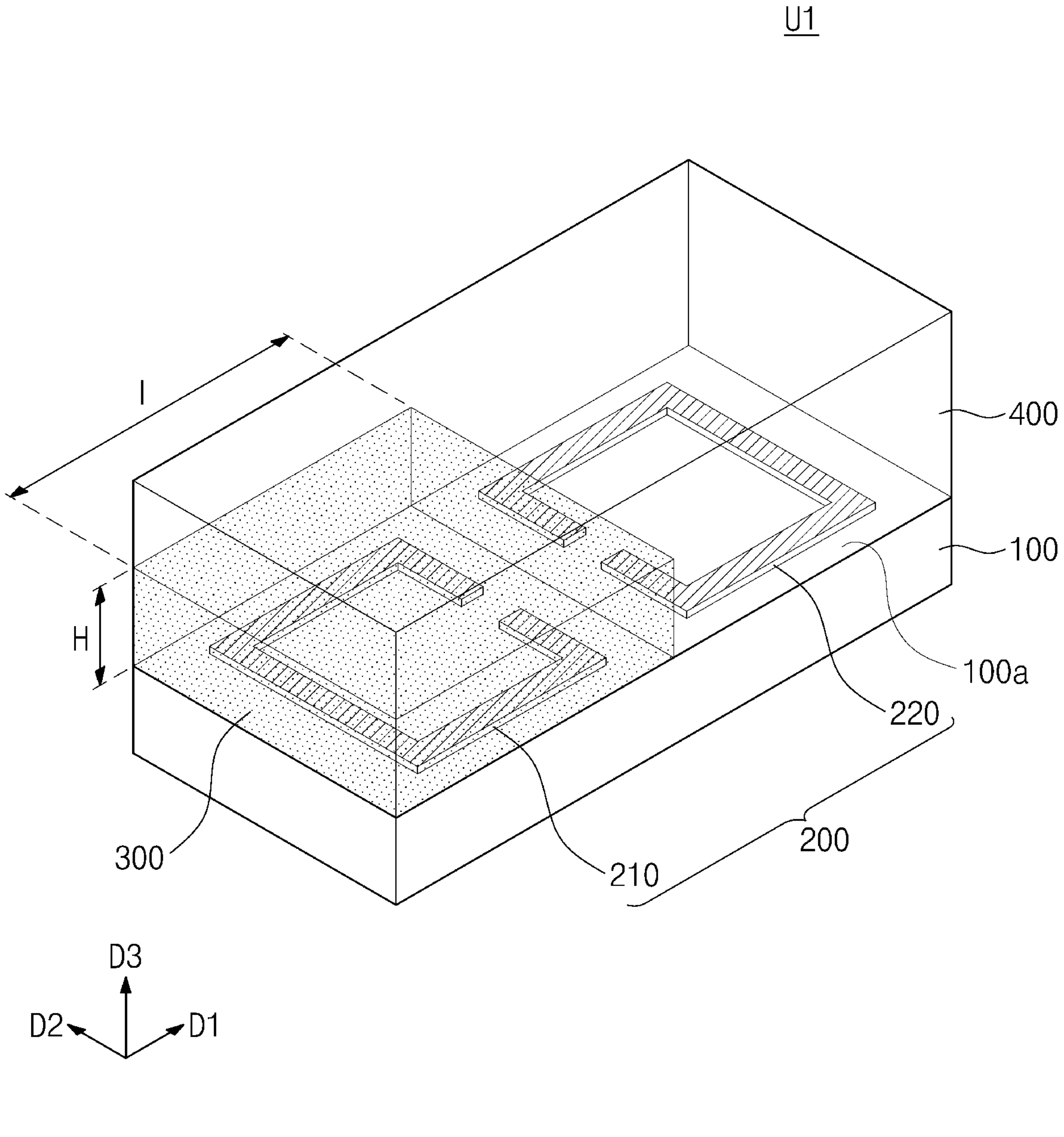
FIG. 2 is a perspective view schematically illustrating a unit cell of a security code according to some embodiments.

FIG. 1 is a plan view schematically illustrating a security code including metamaterials according to an embodiment of the inventive concept. FIG. 2 is a perspective view schematically illustrating a unit cell of the security code according to some embodiments.

Referring to FIGS. 1 and 2, the security code 1000 including metamaterials according to the inventive concept may include a substrate 100, metamaterials 200, a signal modulation pattern 300, and a capping layer 400.

The substrate 100 may be one of a polymer substrate or a semiconductor substrate. The polymer substrate may include a polymer such as polyamide, polydimethylsiloxane or the like. The semiconductor substrate may be a substrate composed of silicon (Si), gallium arsenide (GaAs), germanium (Ge) or the like. According to an embodiment, the substrate 100 may be flexible substrate of adhesive polyamide. The substrate 100 may be designed to have a separate adhesive material attached onto the bottom surface in a sticker type and thus be easily detachably attached to a product requiring security.

A metamaterial array 200A may be disposed on the substrate 100. The metamaterial array 200A may include a plurality of first unit cells U1.

The first unit cells U1 may be disposed along a first direction D1 and a second direction D2 that are parallel to the top surface 100A of the substrate 100. The second direction D2 may be one direction vertically crossing the first direction D1.

Each of the first unit cells U1 may include the metamaterials 200. The metamaterials 200 may include a first metal pattern 210 and a second metal pattern 220 that are disposed adjacently to each other along the first direction D1. Each of the first metal pattern 210 and the second metal pattern 220 may have a split ring shape. The first metal pattern 210 and the second metal pattern 220 may be disposed to have mirror images of each other. For example, the first metal pattern 210 and the second metal pattern 220 may have rectangular ring shapes respectively, and be disposed so that split parts thereof face each other.

Each thickness of the first and second metal patterns 210 and 220 may be about 80 nm to about 300 nm. The thickness and height disclosed herein mean the lengths in a third direction D3 vertical to the top surface 100*a* of the substrate 100. The thicknesses of the first and second metal patterns 210 and 220 may be substantially the same. The first metal pattern 210 and the second metal pattern 220 may include any one of gold (Au), silver (Ag), copper (Cu), or platinum (Pt). The first metal pattern 210 and the second metal pattern 220 may be provided on the substrate 100 through embossed patterning in a photolithography process. According to some embodiments, the first metal pattern 210 and the second metal pattern 220 may have an adhesive layer interposed therebetween. Each width of the first and second metal patterns 210 and 220 and an interval therebetween may be tens of micrometers.

The signal modulation pattern 300 may be disposed on a portion of the first unit cell U1. For example, the signal modulation pattern 300 may be disposed on one of the first metal pattern 210 and the second metal pattern 220, and expose the other (see FIG. 2). As another example, the signal modulation pattern 300 may be disposed on a portion of the first metal pattern 210 and a portion of the second metal pattern 220, and expose the remaining of the first metal pattern 210 and the remaining of the second metal pattern 220 (see FIG. 1). In this case, a first planar area covering the first metal pattern 210 of the signal modulation pattern 300 may be larger or smaller than a second planar area covering the second metal pattern 220 of the signal modulation pattern 300. In other words, the planar area vertically overlapping the first metal pattern 210 of the signal modulation pattern 300 may be larger or smaller than the second planar area vertically overlapping the second metal pattern 220 of the signal modulation pattern 300*s*. As another example, the signal modulation pattern 300 may be disposed on a portion of the first metal pattern 210 and the entirety of the second metal pattern 220, and expose the remaining of the first metal pattern 210 (see FIG. 1). Similarly, the signal modulation pattern 300 may be disposed on the entirety of the first metal pattern 220 and a portion of the second metal pattern 210, and expose the remaining of the second metal pattern 220.

The signal modulation pattern 300 may be provided in plurality as in FIG. 1, and the plurality of signal modulation patterns 300 may be spaced apart from each other in the first direction D1 and extend in the second direction D2. In this case, one extending signal modulation pattern 300 may be provided on the first unit cells U1 that are arranged along the second direction D2. According to some embodiments, the signal modulation pattern 300 may be provided in plurality, and the plurality of modulation patterns 300 may be segmented and spaced apart from each other in the first direction D1 and the second direction D2.

As shown in FIG. 2, the signal modulation pattern 300 may have the width I along the first direction D1 and the thickness h along the third direction D3 on the first unit cells U1. The width I and the thickness h may be freely adjusted.

According to some embodiments, the security code 1000 may include the signal modulation patterns 300 having different widths I and/or the signal modulation patterns 300 having different thicknesses h.

The signal modulation pattern 300 may include a material different from the metamaterials 200. For example, the signal modulation pattern 300 may include a material such as a semiconductor material, graphene, a two-dimensional material, a metal compound or the like. The semiconductor material may be a material such as silicon (Si), germanium (Ge), or gallium arsenide (GaAs). For example, the signal modulation pattern may be a semiconductor pattern.

The capping layer 400 may cover the signal modulation pattern 300, the metamaterial 200, and the top surface of the substrate 100. The capping layer 400 may include, for example, an insulation material. The insulation material may be one of various insulation materials such as silicon oxide ($SiO2$), silicon nitride (SiN), polyimide or the like.

According to the spirit of the inventive concept, the security code 1000 may include metamaterials 200 that may be identified only in a terahertz band, and the metamaterials 200 may be covered with the capping layer 400 to be prevented from being exposed. The capping layer 400 may prevent light in another band, such as visible light, ultraviolet light or the like from being incident to the metamaterials 200. As a result, the metamaterials 200 may be identified only in a terahertz band of about 0.1 THz to about 10 THz. In addition, the signal modulation patterns 300 may be asymmetrically disposed on the first unit cell U1. In other words, the signal modulation patterns 300 may be asymmetrically disposed on the metamaterials 200. In the specification, the term “asymmetrically” is the opposite of “symmetrically”, and “symmetrically” means that contact areas and contact positions between the signal modulation patterns 300 and the first metal pattern 210 are the same as those between the signal modulation patterns 300 and the second metal pattern 220. For example, that the signal modulation pattern 300 covers the entirety of the first metal pattern 210 and the entirety of the second metal pattern 220 corresponds to a symmetric positional relationship. The relationships other than the example symmetric relationship are defined as asymmetric relationships.

When terahertz waves are incident to the security code 1000, a terahertz signal may be modulated by the signal modulation patterns 300. Due to the signal modulation, a Fano resonance phenomenon may occur. A resonance is a phenomenon in which a wave at a specific frequency in a spectrum vibrates with a larger amplitude. While a spectral line of a typical resonance has the shape of a symmetric spectral line, the Fano resonance has the shape of an asymmetric spectral line.

In the inventive concept, the signal modulation pattern 300 may be patterned in various ways on the metamaterials to provide an asymmetric structure. Here, data may be freely encrypted using the Fano resonance appearing in a spectrum.

Figure 3:
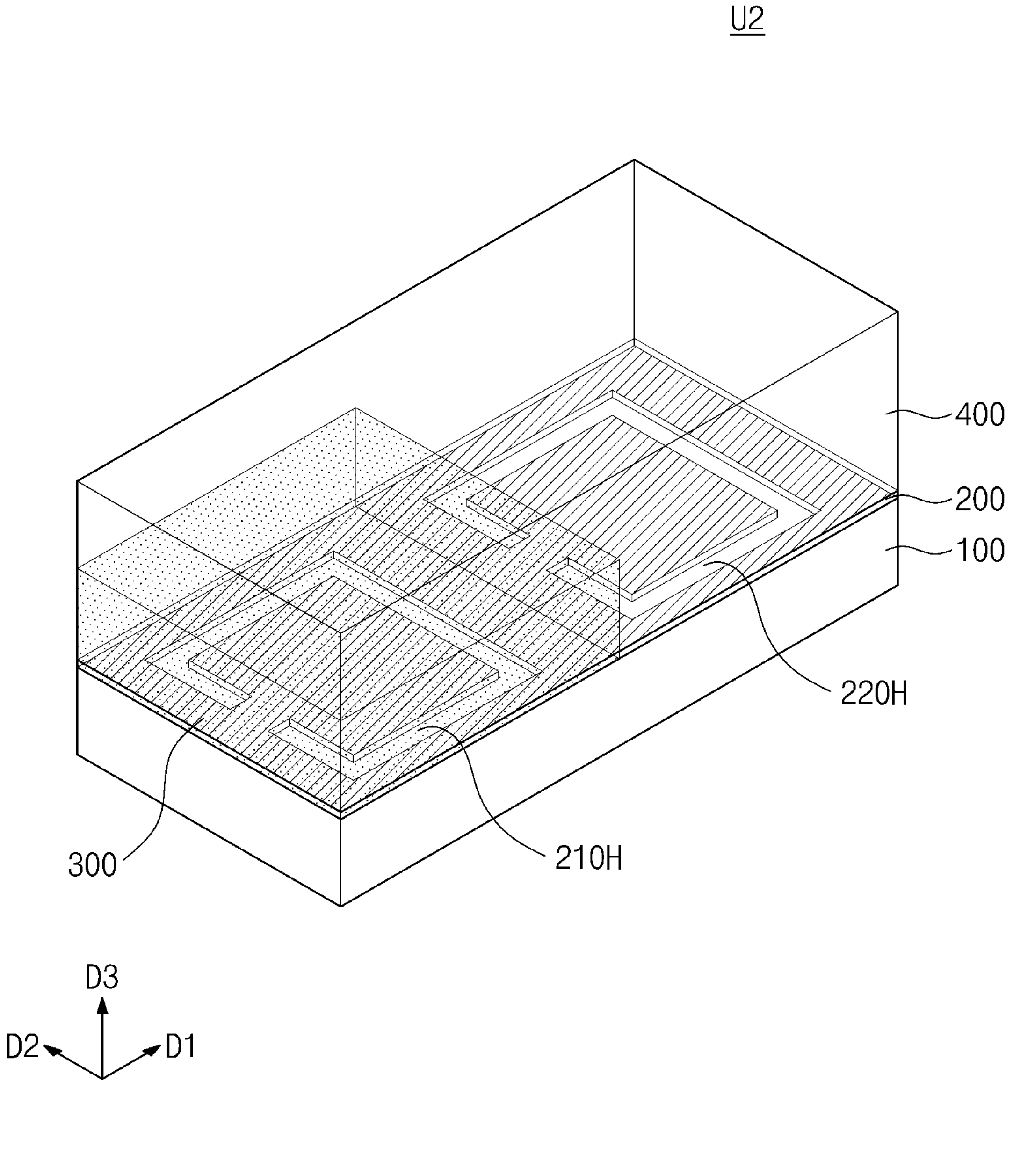
FIG. 3 is a perspective view schematically illustrating a unit cell of a security code according to some embodiments.

FIG. 3 is a perspective view schematically illustrating a unit cell of a security code according to some embodiments. Except as described below, repetitive description of the descriptions of FIGS. 1 and 2 will be omitted.

Referring to FIG. 3, the metamaterials 200 may be disposed on the substrate 100. The metamaterials 200 may be a metal layer. The metamaterials 200 may include a plurality of second unit cells U2. Disposed in each of the second unit cells U2 a first pattern hole 210H and a second pattern hole 220H that respectively correspond to the first metal pattern 210 and the second metal pattern 220 in FIGS. 1 and 2. The first pattern hole 210H and the second pattern hole 220H may respectively have the shapes in which the split rings are intaglio patterned The metamaterials 200 may include any one of gold (Au), copper (Cu), or platinum (Pt). The first pattern hole 210H and the second pattern hole 220H may or may not expose the top surface of the substrate 100. The second unit cells U2 may be provided in plurality to constitute an array as shown in FIG. 1.

Figure 4:
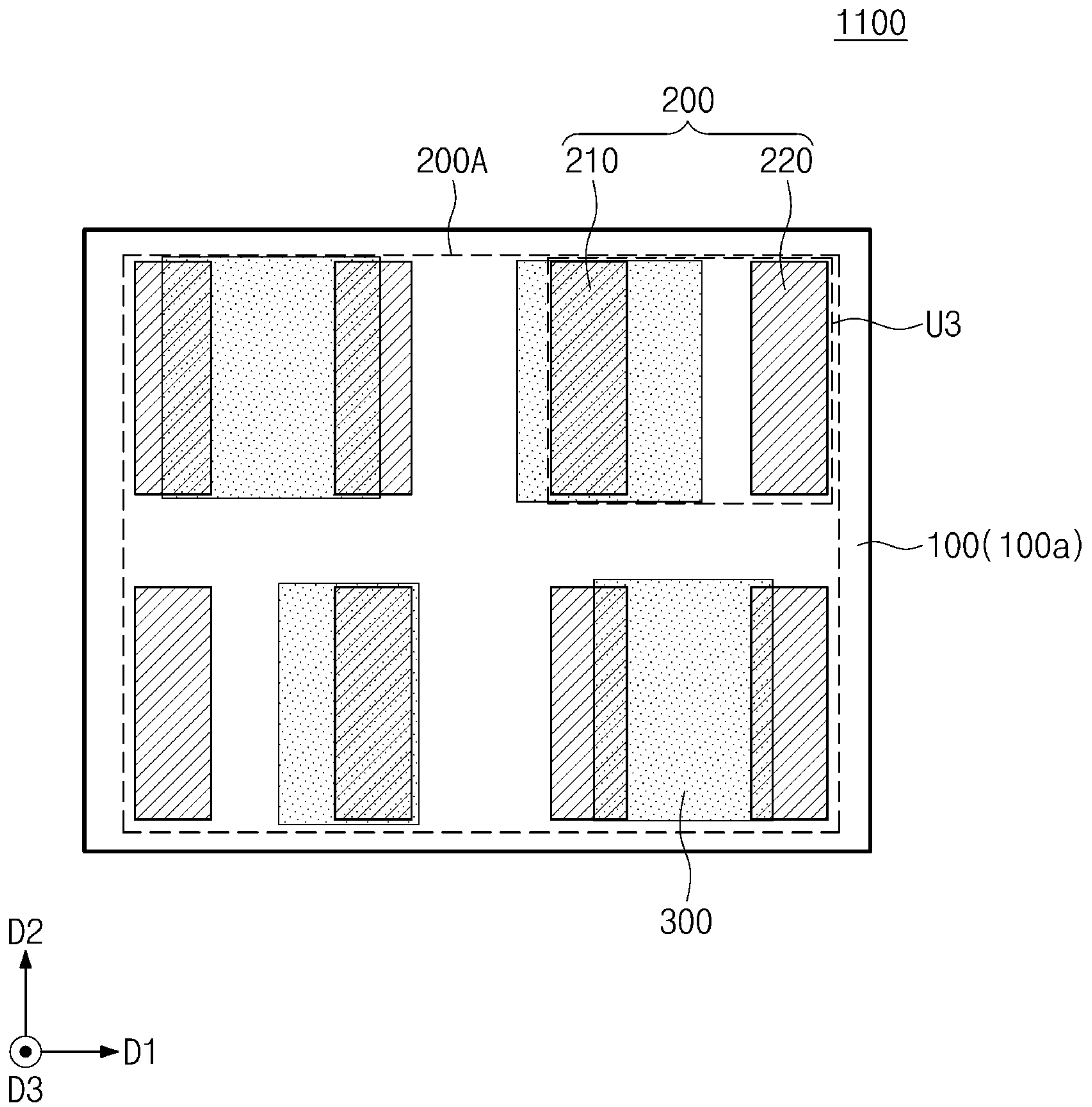
FIG. 4 is a plan view schematically illustrating security codes according to some embodiments.

FIG. 4 is a plan view schematically illustrating a security code according to some embodiments. Except as described below, repetitive description of the descriptions of FIGS. 1 and 2 will be omitted.

Referring to FIG. 4, a security code 1100 according to some embodiments may be provided. The metamaterial array 200A may be disposed on the substrate 100. The metamaterial array 200A may include a plurality of third unit cells U3. Each of the third unit cells U3 may include the metamaterials 200. The metamaterials 200 may include the first metal pattern 210 and the second metal pattern 220 that are spaced apart from each other in the first direction D1. Each of the first metal pattern 210 and the second metal pattern 220 may have a rectangular parallelepiped shape. The first metal pattern 210 and the second metal pattern 220 may be disposed to have mirror images of each other. Each of the first metal pattern 210 and the second metal patterns 220 may have the shape in which a metal layer is embossed patterned. The signal modulation patterns 300 may be spaced apart along the first direction D1 and the second direction D2.

According to some embodiments, the metamaterials may be provided to include a plurality of slots by intaglio-patterning, in the metal layer, the first and second pattern holes respectively corresponding to the first metal pattern 210 and the second metal pattern.

Figure 5:
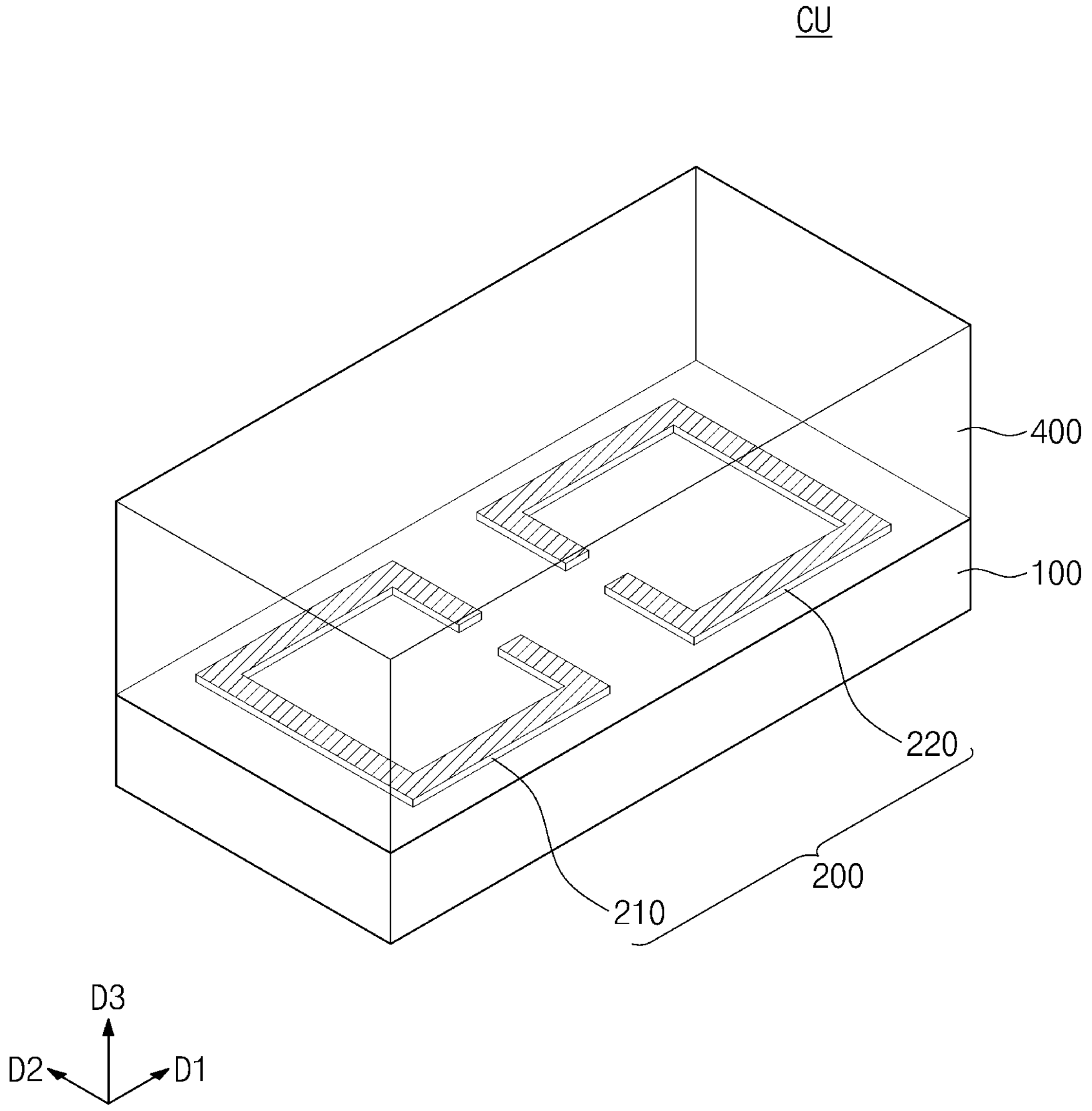
FIG. 5 is a perspective view schematically illustrating a unit cell of a security code according to a comparative example.
Figure 6:
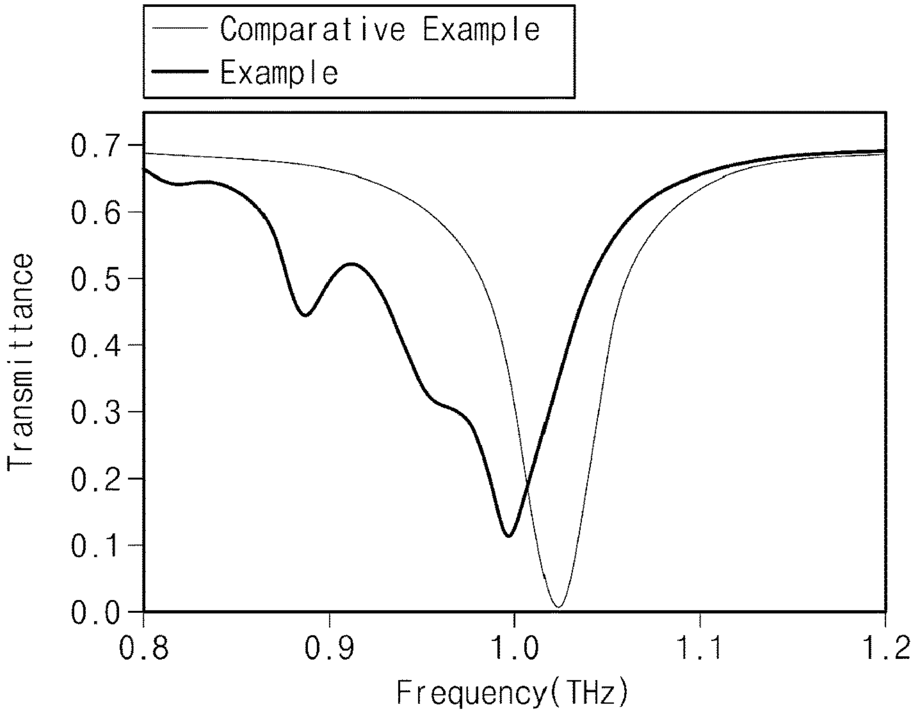
FIG. 6 is a graph showing the transmittance of terahertz waves according to an example and a comparative example.

FIG. 5 is a perspective view schematically illustrating a unit cell of a security code according to a comparative example. FIG. 6 is a graph showing the transmittances of terahertz waves according to an example and a comparative example.

When the unit cell CU according to the comparative example is compared with the first unit cell U1 according to the embodiment in FIG. 2, the security code according to the comparative example may not include the signal modulation pattern 300. Accordingly, even if the terahertz waves are irradiated, a signal is not modulated on the first metal pattern 210 and the second metal pattern 220 in the unit cell CU, and the Fano resonance may be not observed either.

Resonance phenomena are all observed around about 1 THz frequency from both the example and comparative example in FIG. 6. According to the comparative example, the characteristics due to the resonance are shown in about 1.02 THz, and a symmetric transmittance spectrum is shown at the corresponding point. According the example, a resonance is also observed at about 0.89 THz in addition to about 1 THz. In other words, the Fano resonance is observed in the example, but is not observed in the comparative example.

Figure 7:
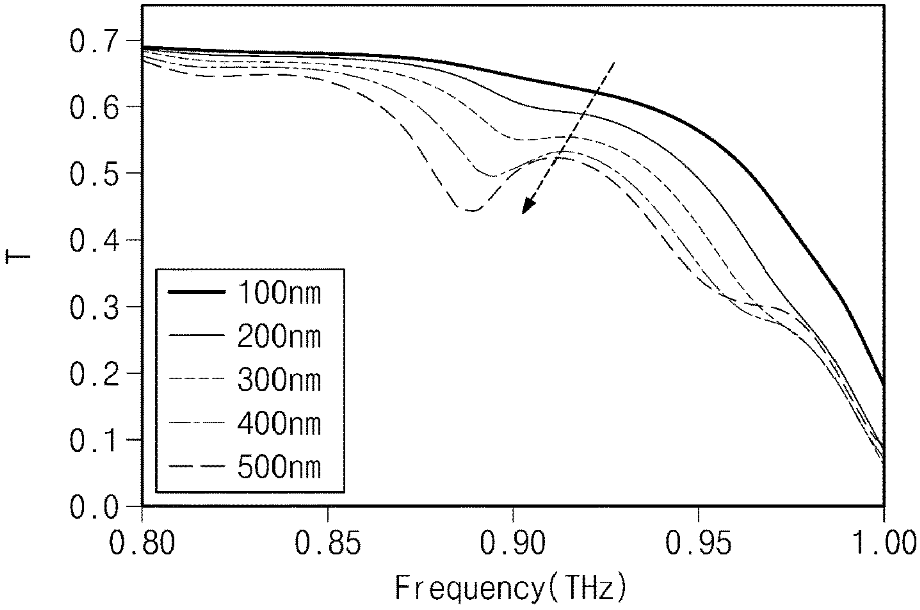
FIG. 7 is a graph showing the transmittance of terahertz waves according to the thickness of a signal modulation pattern.

FIG. 7 is a graph showing the transmittance of the terahertz waves according to the thickness of the signal modulation pattern.

Referring to FIGS. 2 and 7, it may be understood that as the thickness h of the signal modulation pattern 300 increases, the asymmetricity of the spectrum increases. Information corresponding to each spectrum may be matched using the spectrum characteristics that change according to the thickness h of the signal modulation pattern 300. Furthermore, the information is possibly encrypted by adjusting the thickness h of the signal modulation pattern 300.

Figure 8:
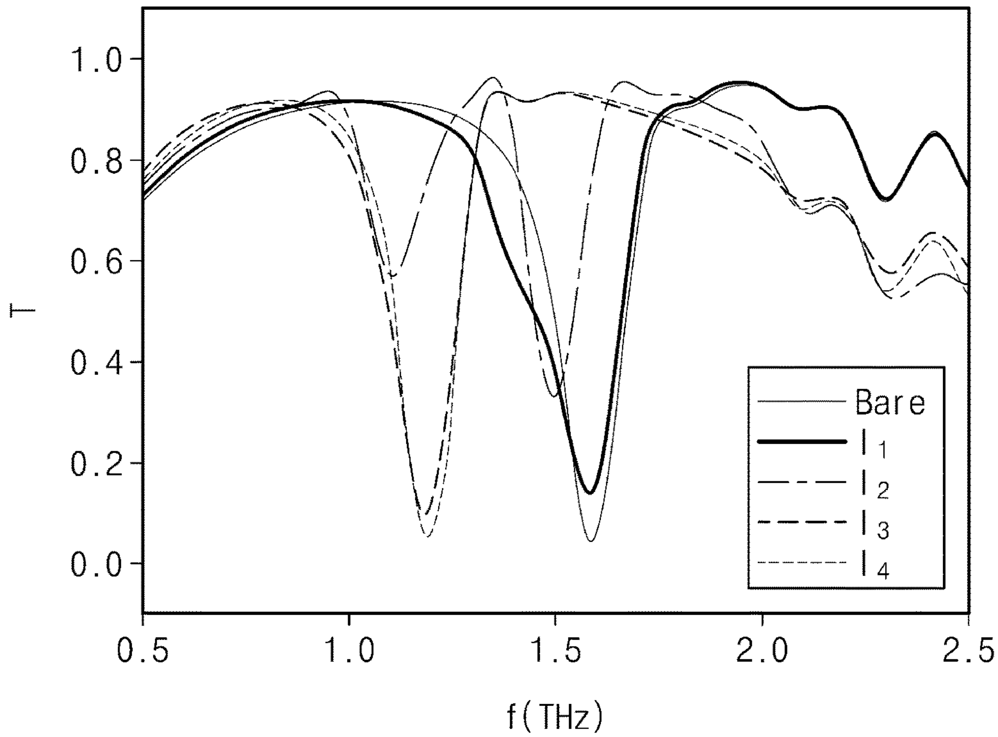
FIG. 8 is a graph showing the transmittance of terahertz waves according to the width of a signal modulation pattern.

FIG. 8 is a graph showing the transmittance of terahertz waves according to the width of the signal modulation pattern.

Referring to FIGS. 2 and 8, it may be understood that as the width I of the signal modulation pattern 300 increases, the shapes of the spectra (Bare<I1<I2<I3<I4) appear differently. In other words, by adjusting the width I and shape of the signal modulation pattern 300, various resonance frequencies may be selected and the information may be encrypted.

Figure 9:
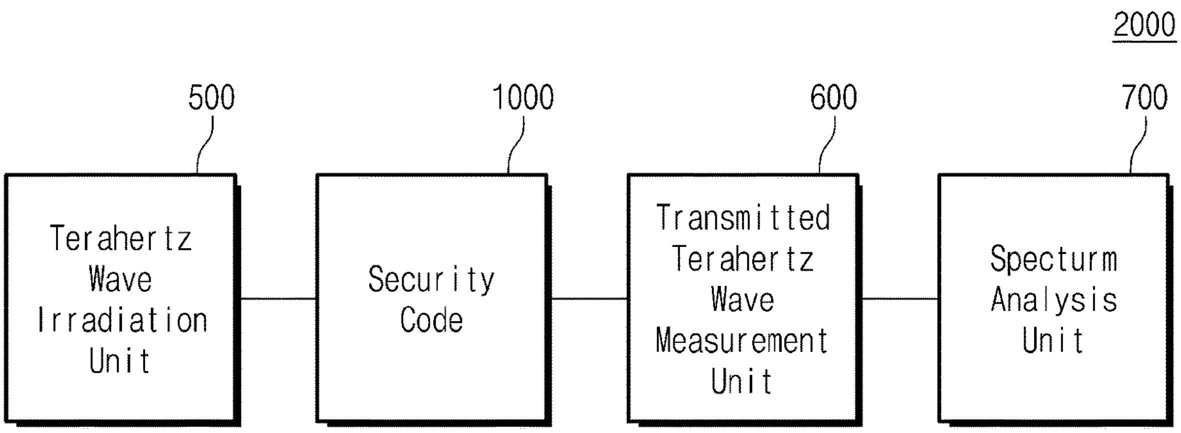
FIG. 9 schematically shows a security system including a security code.
Figure 10:
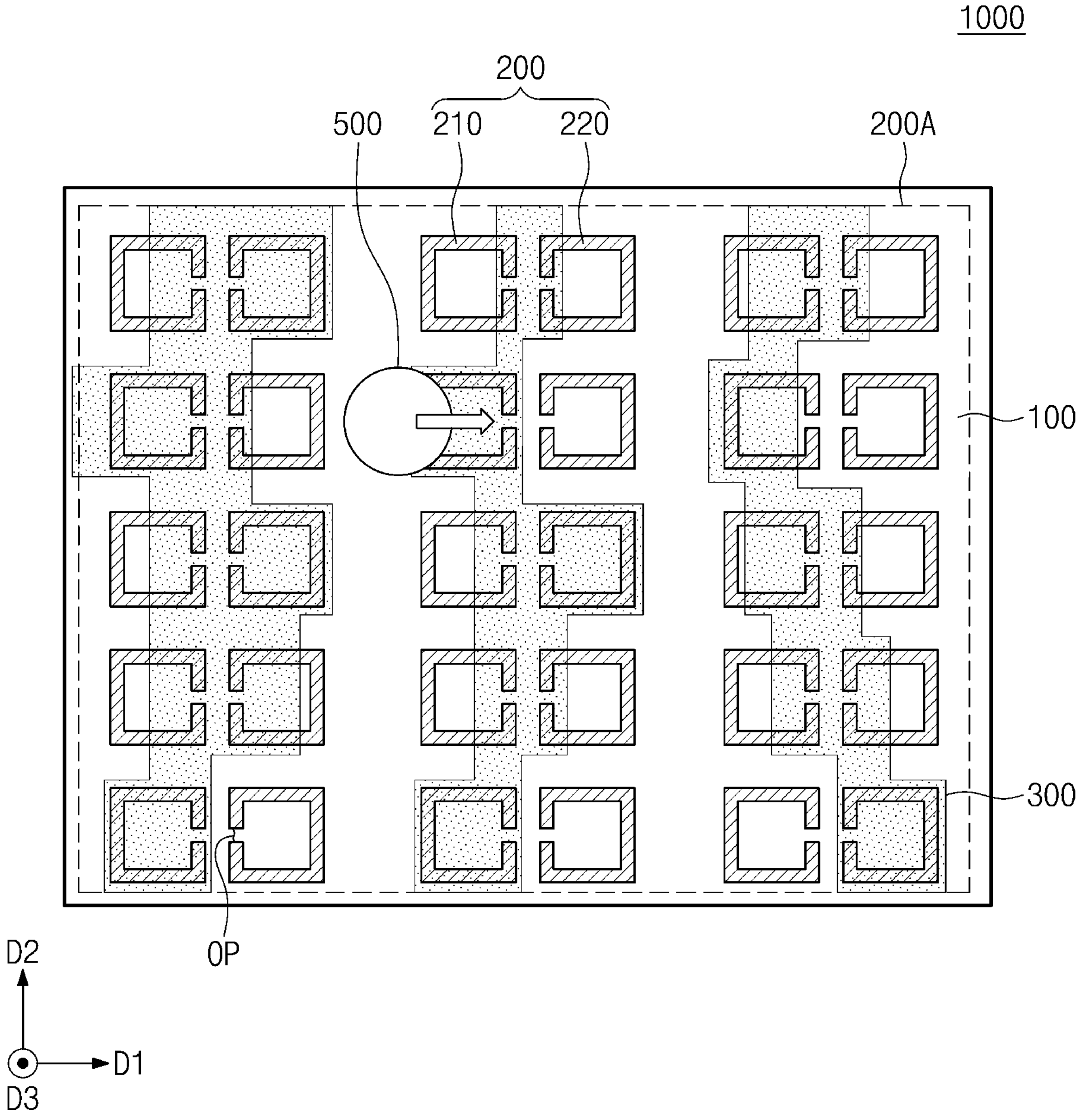
FIG. 10 is a conceptual view illustrating that a security code is irradiated with terahertz waves.
Figure 11:
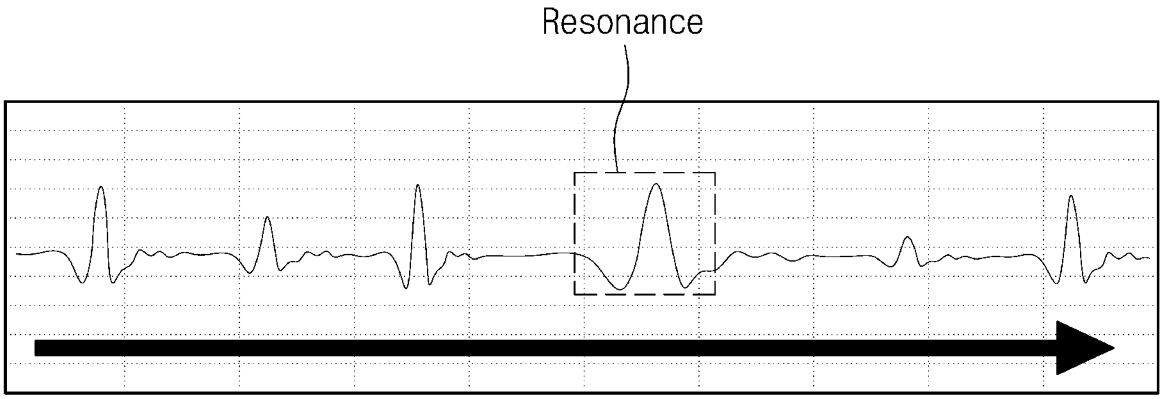
FIG. 11 is a graph of terahertz waves transmitted through a security code measured on the basis of a time.

FIG. 9 schematically shows a security system including the security code. FIG. 10 is a conceptual view illustrating that the security code is irradiated with the terahertz wave light. FIG. 11 is a graph of the light transmitted through the security code on the basis of a time.

Referring to FIG. 9, the security system 2000 may include a security code 1000, a terahertz wave irradiation unit 500, a transmitted terahertz wave measurement unit 600, and a spectrum analysis unit 700.

Referring to FIGS. 9 and 10, the terahertz wave irradiation unit 500 may output terahertz waves by means of, for example, a femtosecond laser having about a 800 nm wavelength, and irradiate the security code 1000 with the terahertz waves.

The terahertz wave measurement unit 600 measures a spectrum and a transmission amount of the terahertz waves transmitted through the unit cell U or the metamaterial array 200A.

As shown in FIG. 11, the spectrum analysis unit 700 analyzes data measured on a time-axis and converts the time-axis data into frequency-axis data by means of a computer, and then analyzes a terahertz spectrum to interpret the encrypted signal. Terahertz time-domain spectroscopy set to analyze the spectrum is used.

The inventive concept may include the metamaterials and signal modulation pattern operating in the terahertz band, and adjust the interaction between them to encrypt the information. For example, the inventive concept may be applied to a signature hidden in a work of art. Since the terahertz waves are transmitted through a pigment and other materials, the corresponding pattern may be hidden between paints and a canvas to be used as a security code. In addition, the security code according to the inventive concept may also be used for products manufactured in multiple layers on the basis of high permeability. The inventive concept may also be applied to products such as medicine, clothing or the like.

According to the present disclosure, the signal modulation patterns may be patterned in various ways on the metamaterials to provide an asymmetric structure. Here, data may be freely encrypted using the Fano resonance appearing in a spectrum.

Although the embodiments of the present invention have been described above with reference to the accompanying drawings, the present invention may be implemented without changing the technical spirit or essential features thereof. The embodiments described above are therefore considered to be illustrative in all respects and not restrictive.

What is claimed is:

1. A security code comprising:
a substrate;
metamaterials on the substrate;
a signal modulation pattern on the metamaterials; and
a capping layer covering the signal modulation pattern and the metamaterials,
wherein the metamaterials comprise a pair of metal patterns facing each other,
the signal modulation pattern covers a portion of the metal patterns, and expose remaining of the metal patterns,
the signal modulation pattern has a different material from each of the metal patterns,
the signal modulation pattern is disposed on an upper surface of at least one of the metal patterns to overlay the metal patterns asymmetrically, and
the pair of metal patterns are separate patterns physically spaced apart from each other.

2. The security code of claim 1, wherein each of the pair of metal patterns has a split ring shape.

3. The security code of claim 2, wherein any one of the metal patterns has a relationship of a mirror image with another metal pattern.

4. The security code of claim 2, wherein split parts of the pair of metal patterns face each other.

5. The security code of claim 1, wherein the signal modulation pattern comprises any one of a semiconductor material, a two-dimensional material, or a metal compound.

6. The security code of claim 5, wherein the semiconductor material comprises any one of silicon (Si), germanium (Ge), silicon-germanium (Si—Ge), or gallium arsenide (GaAs).

7. The security code of claim 1, wherein each of the metal patterns comprises any one of gold (Au), silver (Ag), copper (Cu), or platinum (Pt).

8. The security code of claim 1, wherein the substrate comprises polymer or semiconductor.

9. The security code of claim 1, wherein each thickness of the metal patterns is about 80 nm to about 300 nm.

10. The security code of claim 1, wherein the signal modulation pattern covers any one of the pair of metal patterns, and does not cover another.

11. The security code of claim 1, wherein the signal modulation pattern covers all the pair of metal patterns,
wherein a planar area covering the any one of the pair of metal patterns is greater than a planer area covering another.

12. The security code of claim 1, wherein each of the pair of metal patterns has a rectangular parallelepiped shape.

13. The security code of claim 1, wherein the capping layer includes a material through which terahertz waves in a band of about 0.1 THz to about 10 THz are transmitted to the metal patterns.

14. A security code comprising:
a substrate;
a metamaterial array on the substrate;
a plurality of signal modulation patterns on the metamaterial array; and
a capping layer covering the signal modulation pattern and the metamaterial array,
wherein the metamaterial array comprises a plurality of unit cells,
each of the unit cells comprises a first metal pattern and a second metal pattern that are separate patterns physically spaced apart from each other along a first direction parallel to a top surface of the substrate,
the first metal pattern and the second metal pattern have a symmetric shape,
the signal modulation patterns are respectively disposed on the unit cells,
each of the signal modulation patterns is disposed on an upper surface of at least one of the first and second metal patterns to asymmetrically overlay the first metal pattern and the second metal pattern, the signal modulation patterns have a different material from the first metal pattern and the second metal pattern.

15. The security code of claim 14, wherein the signal modulation pattern covers an entirety of the first metal pattern, and exposes at least a portion of the second metal pattern.

16. The security code of claim 14, wherein the signal modulation pattern covers the first metal pattern and the second metal pattern, and a planar area vertically overlapping the first metal pattern of the signal modulation pattern is larger than a second planar area vertically overlapping the second metal pattern of the signal modulation pattern.

* * * * *